(12) United States Patent
Habets et al.

(10) Patent No.: US 7,783,444 B2
(45) Date of Patent: Aug. 24, 2010

(54) SYSTEMS AND METHODS OF ALTERNATIVE OVERLAY CALCULATION

(75) Inventors: Boris Habets, Dresden (DE); Michiel Kupers, Dresden (DE)

(73) Assignee: Qimonda AG, Munich (DE)

( * ) Notice: Subject to any disclaimer, the term of this patent is extended or adjusted under 35 U.S.C. 154(b) by 203 days.

(21) Appl. No.: 12/056,134

(22) Filed: Mar. 26, 2008

(65) Prior Publication Data

US 2009/0248337 A1    Oct. 1, 2009

(51) Int. Cl.
*G01N 37/00* (2006.01)
*G01C 17/38* (2006.01)
(52) U.S. Cl. .......................................... 702/94; 702/81
(58) Field of Classification Search ............... 702/81, 702/94; 356/509
See application file for complete search history.

(56) References Cited

U.S. PATENT DOCUMENTS

| | | | |
|---|---|---|---|
| 6,982,793 B1 * | 1/2006 | Yang et al. | 356/401 |
| 2006/0050283 A1 * | 3/2006 | Hill | 356/512 |
| 2007/0229806 A1 * | 10/2007 | Lally et al. | 356/237.1 |
| 2007/0233305 A1 * | 10/2007 | Werkman et al. | 700/121 |

* cited by examiner

*Primary Examiner*—Bryan Bui
*Assistant Examiner*—Jonathan Teixeira Moffat
(74) *Attorney, Agent, or Firm*—Slater & Matsil, L.L.P.

(57) ABSTRACT

Methods and systems of alternative overlay calculation and of calculating overlay stability based on alternative overlay settings in a fabrication unit, and a computer readable medium are disclosed being capable of calculating alternative overlay error values based on alignment model parameters, alternative alignment model parameters, and overlay error values for a plurality of measurement positions.

21 Claims, 4 Drawing Sheets

SYSTEMS AND METHODS OF ALTERNATIVE OVERLAY CALCULATION

TECHNICAL FIELD

Embodiments of the invention relate to methods and systems of alternative overlay calculation and of calculating overlay stability based on alternative overlay settings in a fabrication unit, and a computer readable medium.

DETAILED DESCRIPTION OF ILLUSTRATIVE EMBODIMENTS

Embodiments of methods and systems of alternative overlay calculation and of calculating overlay stability based on alternative overlay settings in a fabrication unit are discussed in detail below. It is appreciated, however, that the present invention provides many applicable inventive concepts that can be embodied in a wide variety of specific contexts. The specific embodiments discussed are merely illustrative of specific ways and do not limit the scope of the invention.

In the following, embodiments of the method and the system are described with respect to determining overlay stability during manufacturing of an integrated circuit. The embodiments, however, might also be useful in other respects, e.g., improvements in process control, improvements in identifying lot to lot variations of a layout pattern, yield enhancement techniques or the like.

Furthermore, it should be noted that the embodiments are described with respect to semiconductor wafers but might also be useful in other respects including but not limited to thin film elements. Other products, e.g., liquid crystal panels or the like might be produced as well.

Figure 1:
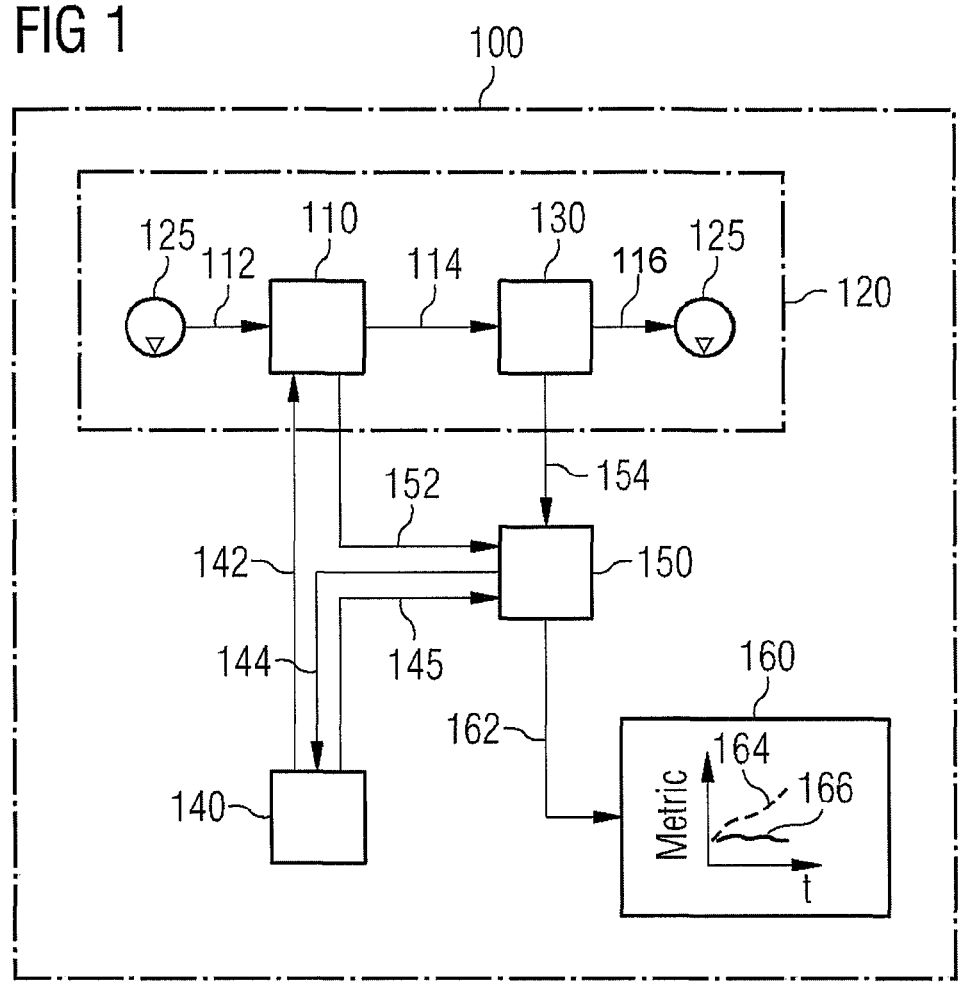
FIG. 1 schematically illustrates a flow for a system of alternative overlay calculation and of calculating overlay stability based on alternative overlay settings according to an embodiment.

A first embodiment is now described making reference to FIG. 1. FIG. 1 shows a system of calculating alternative overlay values in a fabrication unit. As depicted in FIG. 1, system 100 comprises an exposure tool 110 which can be an integral part of a fabrication unit 120. Usually fabrication unit 120 can include further tools required for processing semiconductor wafers. The exposure tool 110 includes a port for loading and unloading semiconductor wafers, as schematically indicated in FIG. 1 by arrows 112 and 114.

A semiconductor wafer 125 is loaded into exposure tool 110. Usually semiconductor wafer 125 is part of a larger amount of semiconductor wafers, commonly known as a lot. Within exposure tool 110 semiconductor wafers 125 are sequentially aligned and then exposed with the desired pattern onto a resist film layer. The desired pattern can be stored on a photomask, for example.

After the mask projection step, semiconductor wafer 125 is forwarded via unload port to an overlay measurement tool 130. The overlay measurement tool 130 can be an integral part of fabrication unit 120, although other configurations are conceivable as well. Furthermore, for the sake of simplicity, intermediate process steps which might be required, such as post-exposure bake and the like, are not shown in FIG. 1.

With an overlay metrology tool 130, the overlay accuracy of the mask projection step is determined. In order to do so an overlay target is usually projected into the resist film layer. This can for instance be a so-called Box-in-Box mark. By measuring this overlay target with respect to an overlay target which has already been formed on the semiconductor wafer 125, overlay can be measured.

After the overlay measurement, semiconductor wafer 125 leaves the overlay metrology tool 130 as indicated by arrow 116. Further processing steps might be required in order to fabricate integrated circuits.

With the ever increasing need for smaller and denser structures on a semiconductor wafer 125, the allowable difference between an actual processed resist film and a previously formed layer decreases as well. The tolerable overlay budget can influence the throughput through fabrication unit 120, as semiconductor wafers which are outside the specification of the tolerable mismatch have to be reworked or otherwise sorted out.

Overlay accuracy depends, among other factors, upon the alignment of the semiconductor wafer 125 with an exposure tool 110. Usually a mask projection step in exposure tool 110 is performed in different exposure fields which are arranged next to each other on the semiconductor wafer 125. Prior to exposure, the wafer is aligned to the projection mask of the exposure tool by use of an alignment system in the exposure tool.

Figure 2:
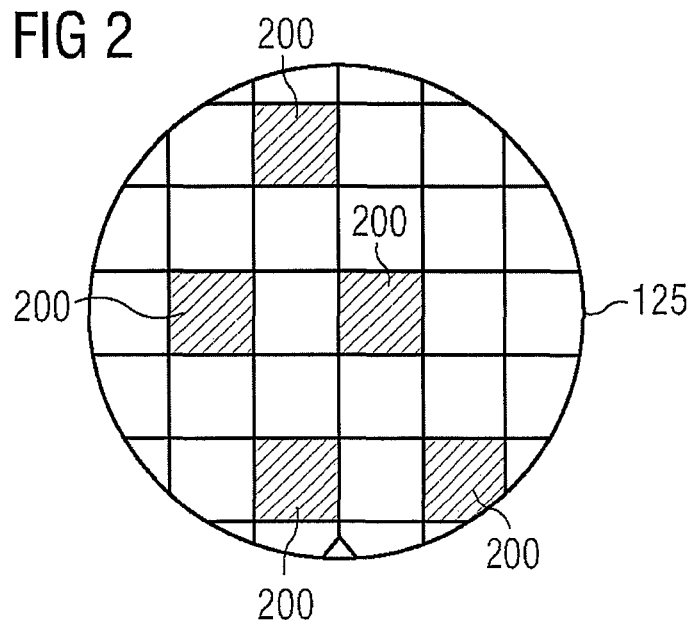
FIG. 2 schematically illustrates a semiconductor wafer in a top view.

The alignment procedure is usually performed on alignment marks from a subsample of exposure fields, as schematically shown in FIG. 2. FIG. 2 shows semiconductor wafer 125 and subsample of five exposure fields 200 which are used during alignment. Within an individual exposure field several different types of marks can be arranged at various positions.

The actual alignment is measured by an alignment system, which optically inspects the alignment marks. The detected signals are further processed and the aligned position is recorded. With the total of aligned positions which are measured on the semiconductor wafer, alignment correction model parameters are calculated using a certain alignment strategy, which can include for example employing optical measurements with different wavelengths, applying different optical filters between the semiconductor wafer 125 and the alignment tool or by using different mathematical models in order to extract the alignment values from the recorded signals. With the calculated alignment correction model parameters, a series of corrections are calculated per exposure field.

Alignment can be optimized by many parameters, which often only have a very limited influence when considered alone. Accordingly it is often quite difficult to find enough significance when trying to optimize the alignment procedure. Furthermore, it is usually experimentally impossible to try out all the settings that might lead to better alignment.

As already stated above, the more critical the overlay becomes the more important it is that the alignment is optimized by an optimization of many parameters. As each individual parameter only has a limited influence on the overall alignment, it is difficult to provide an optimized alignment setting.

Which kind of alignment is actually performed during processing of semiconductor wafer 125 is determined before production can start.

Overlay error values are usually derived for a plurality of measurement positions for each of semiconductor wafer 125. The measurement positions for overlay measurement are selected for different exposure fields, which might be different to the exposure 200 which are shown in FIG. 2 for alignment measurement. Making reference again to FIG. 1, a processing unit 150 is shown, which can be a computer or the like. The processing unit receives raw measured overlay data from the overlay measurement tool 130 via data connection 154 and calculating overlay correction model parameters as well as an overlay metric, being the criterion for the decision whether the measured wafer has been exposed within specification.

The process server 140 calculates recipe tuning parameters from overlay correction model parameters that it received from data processing unit 150 via a data connection 144. The recipe tuning parameters are offsets that the exposure tool should apply on top of its alignment corrections prior to the exposure. The processing unit 150 receives these recipe tuning parameters via a data connection 145. In addition, the processing unit 150 receives alignment data from the exposure tool 110 via data connection 152.

As shown in FIG. 1, process server 140 and processing unit 150 are arranged outside fabrication unit 120. However, other configurations wherein one or both items are located within the fabrication unit 120 are also conceivable. Furthermore, it should be noted that data connections 142, 144, 152 and 154 can be of any type which is suitable for transmitting data between the various components. Furthermore, interface units might be necessary in order to connect the data connections to the appropriate interface of the processing units.

Furthermore, processing unit 150 receives alignment data from the exposure tool 110 via data connection 152. The alignment data includes active alignment values which are applied by the exposure tool 110 for each of semiconductor wafer 125. Furthermore, processing unit 150 receives alternative alignment values which are included in the alignment data. The alternative alignment values are recorded by the exposure tool 110 or by the respective alignment measurement tool within exposure tool 110.

The alternative alignment values are not used during the actual alignment of semiconductor wafer 125. From the active alignment values, processing unit 150 calculates alignment model parameters for each measurement position applied during overlay measurement within overlay tool 130. Furthermore, alternative alignment model parameters are calculated by using the active alignment values which are forwarded from the exposure tool 110 to processing unit 150. Again alternative alignment model parameters are calculated for the measurement positions as explained above.

By using the alignment model parameters, the alternative alignment model parameters and the overlay error values recorded by the overlay measurement tool, it is possible to calculate alternative overlay error values for the measurement positions used for overlay measurements.

In other words, the alternative overlay error values indicate what the overlay would have been, if the alternative alignment model parameters or the alternative alignment strategy would have been used. Accordingly, it is possible to judge overlay performance for different alignment procedures.

Overlay performance can be studied by calculating an overlay metric. The overlay metric indicates the performance of the actual overlay for each semiconductor wafer 125. Possible overlay metrics include a mean plus 3 sigma calculation or a reverse yield calculation. In addition, alignment model parameters can be calculated by incorporating the recipe tuning parameters which are forwarded by process server 140 via data connection 144 to processing unit 150.

As a result, overlay stability can be estimated by calculating the overlay metric for each of one of semiconductor wafer 125. Accordingly, the estimated overlay stability can be provided as an intralot overlay stability for each of the semiconductor wafers 125. In addition, especially when using the recipe tuning parameters, a lot to lot overlay stability can be calculated.

This is schematically shown in FIG. 1 by display unit 160 which receives the calculated overlay metric via data connection 162. The actual overlay stability is indicated as graph 164. For the alternative alignment setting, the overlay metric over time is indicated by graph 166. Accordingly, it is possible to signal that the exposure tool 110 should switch from the active alignment to the alternative alignment, in case the overlay stability for the alternative alignment is superior to the actual setting. Comparing the metrics for a certain number of lots, one can judge very accurately which alignment method would have been better.

Figure 3:
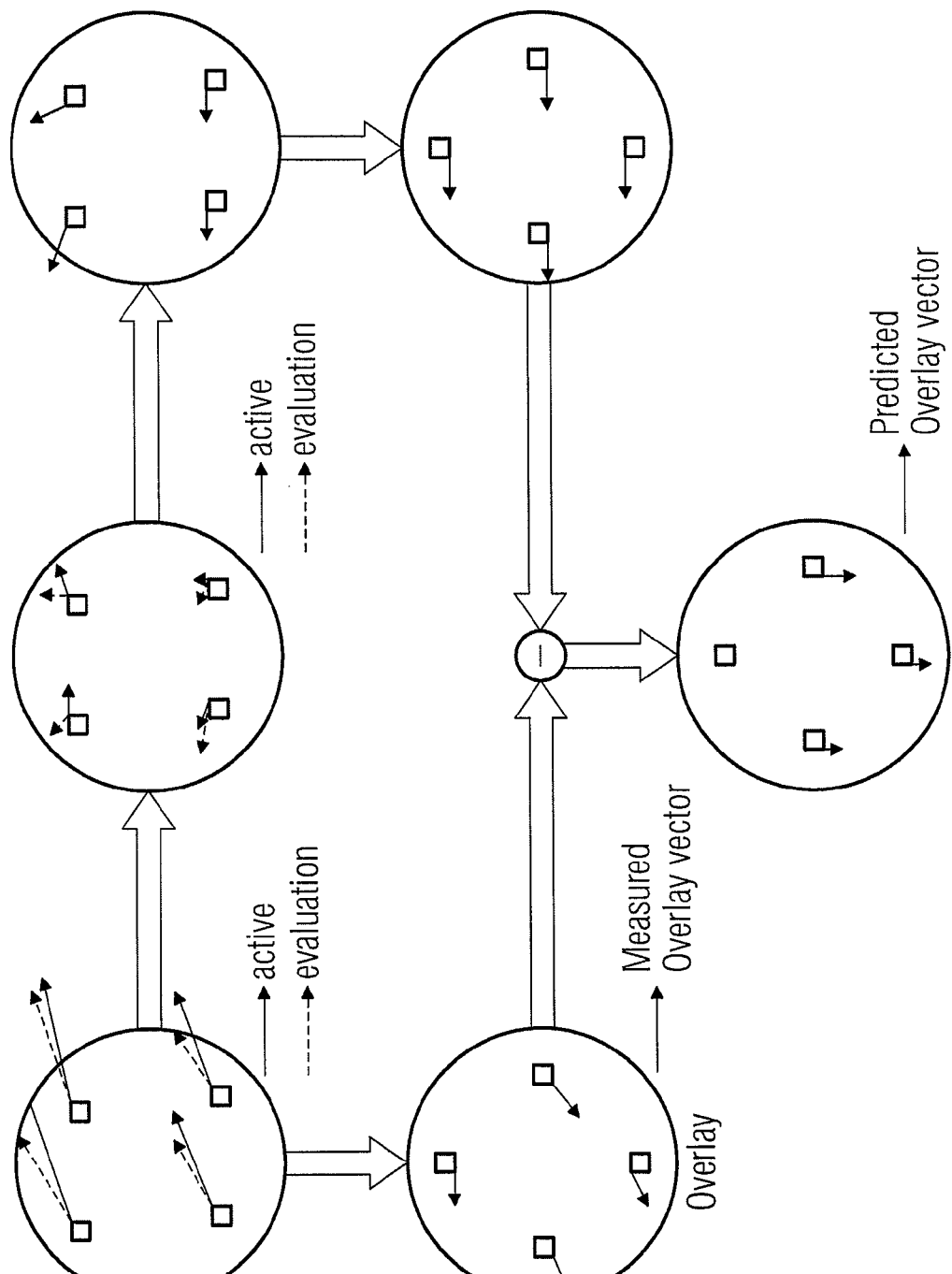
FIG. 3 schematically illustrates a process flow with a semiconductor wafer according to an embodiment.

A method of calculating alternative overlay error values or calculating overlay stability based on alternative alignment settings is now summarized making reference to FIG. 3. The alignment data provided by the exposure tool 110 is provided for alternative alignment values and active alignment values.

The alternative alignment values are used for evaluation, as indicated in FIG. 3. Alternative alignment values can include alignment marks from alternative exposure fields on the semiconductor wafer 125 with respect to the exposure fields used in the active alignment. Alternative alignment values can also include alignment values of alternative alignment mark types with respect to the active alignment. Alternative alignment recipes could be used in the alternative alignment strategy and in addition an alternative alignment model can be applied with respect to the active alignment.

It should be noted that it is also possible to apply a combination of all different alternative alignment strategies. In the next step, alignment residuals are shown after subtraction of the active alignment model parameters. Then the difference between the active and the alternative model parameters are calculated and applied to the overlay error values at the measured overlay positions. By subtracting the measured overlay error values and the predicted overlay error values, the predicted overlay vector can be calculated, as shown in FIG. 3.

Figure 4:
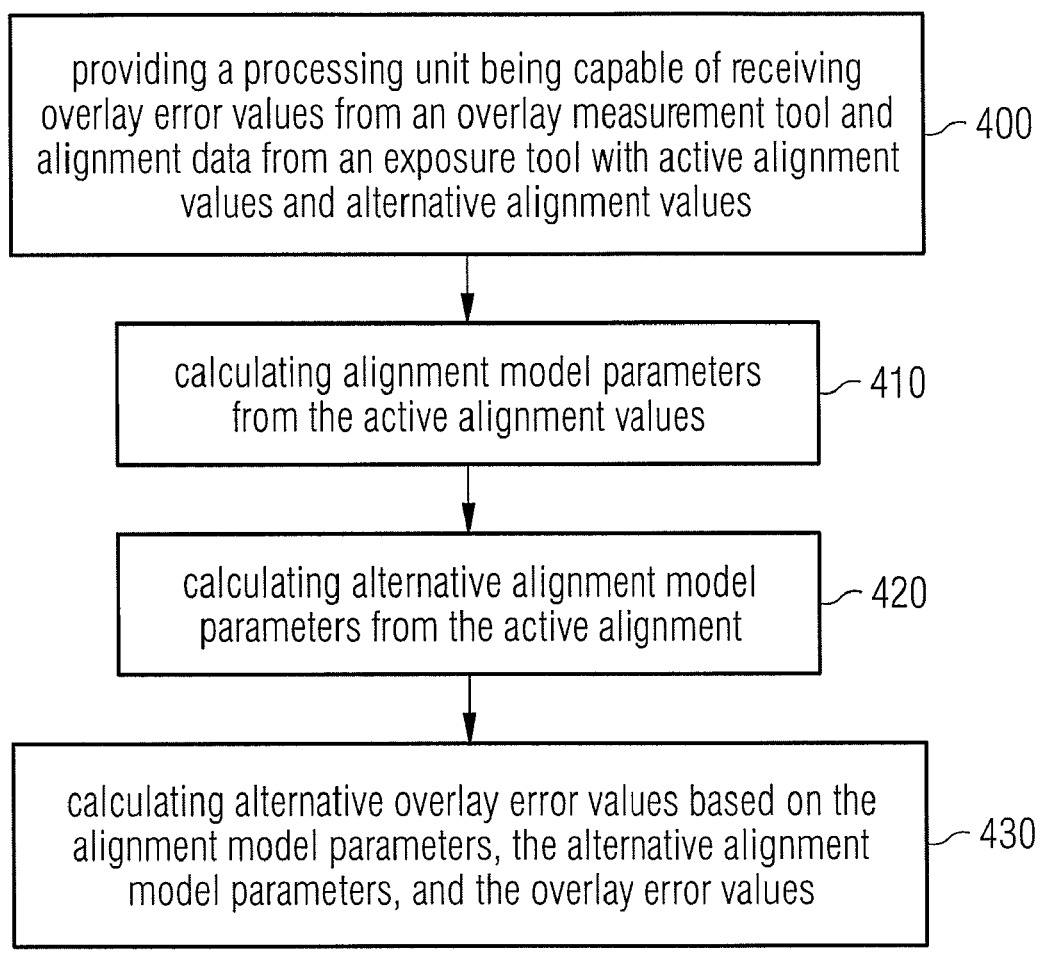
FIG. 4 illustrates a flow chart of method steps of alternative overlay calculation according to a further embodiment.

In FIG. 4, a flow diagram is shown with individual process steps of alternative overlay In step 400, a processing unit is provided being capable of receiving overlay error values from an overlay measurement tool and alignment data from an exposure tool with active alignment values and alternative alignment values.

In step 410, alignment model parameters from the active alignment values are calculated.

In step 420, alternative alignment model parameters from the active alignment are calculated.

In step 430 alternative overlay error values based on the alignment model parameters, the alternative alignment model parameters, and the overlay error values are calculated.

Figure 5:
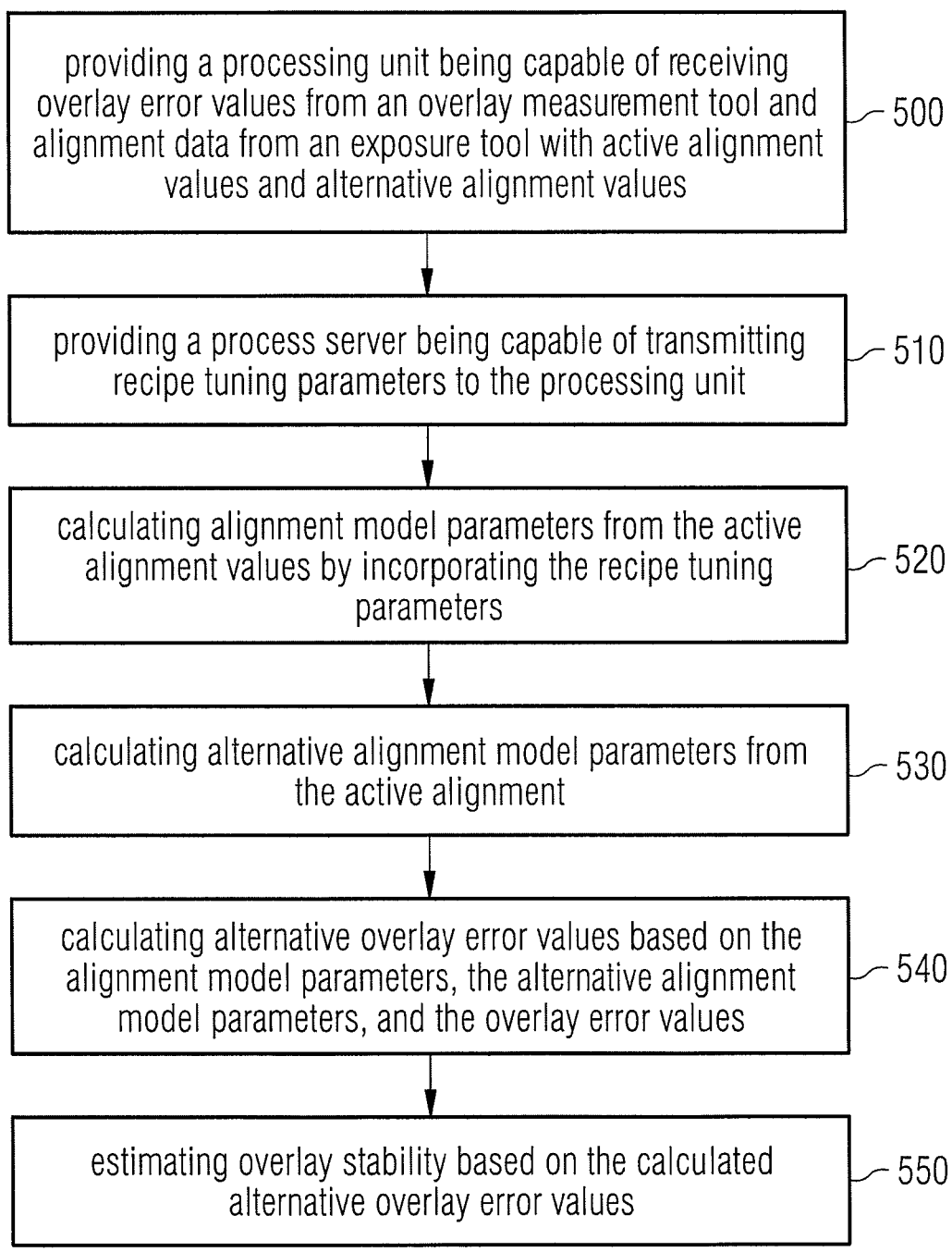
FIG. 5 illustrates a flow chart of method steps of calculating overlay stability based on alternative overlay settings in a fabrication unit according to a further embodiment.

In FIG. 5 a flow chart of process steps of calculating overlay stability based on alternative overlay settings in a fabrication unit is shown.

In step 500, a processing unit is provided being capable of receiving overlay error values from an overlay measurement tool and alignment data from an exposure tool with active alignment values and alternative alignment values.

In step 510, a process server being capable of transmitting recipe tuning parameters to the processing unit is provided.

In step 520, alignment model parameters from the active alignment values are calculated by incorporating the recipe tuning parameters.

In step 530, alternative alignment model parameters from the active alignment are calculated.

In step 540, alternative overlay error values based on the alignment model parameters, the alternative alignment model parameters, and the overlay error values are calculated.

In step 550, overlay stability based on the calculated alternative overlay error values is estimated.

It should be noted that the above process steps can be implemented as a software product being stored on a computer readable medium, like a CD, DVD, hard disk, or the like.

Having described embodiments of the invention, it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and the particularity required by the patent laws, what is claimed and desired to be protected by Letters Patent is set forth in the appended claims.

What is claimed is:

1. A method of alternative overlay calculation in a fabrication unit, the method comprising:
providing a processing unit, the processing unit being capable of receiving overlay error values from an overlay measurement tool for a plurality of measurement positions on a plurality of semiconductor wafers, and alignment data from an exposure tool suitable for exposing the plurality of semiconductor wafers, the alignment data comprising active alignment values applied by the exposure tool to respective ones of the plurality of semiconductor wafers and alternative alignment values recorded by the exposure tool;
calculating, with a processing unit, alignment model parameters from the active alignment values as applied by the exposure tool for the plurality of measurement positions;
calculating, with a processing unit, alternative alignment model parameters from the active alignment values for the plurality of measurement positions; and
calculating, with a processing unit, alternative overlay error values based on the alignment model parameters, the alternative alignment model parameters, and the overlay error values for the plurality of measurement positions, wherein the alternative overlay error values comprise alternative alignment recipes of alignment marks on the plurality of wafers with respect to the active alignment values.

2. The method according to claim 1, further comprising providing a process server, the process server being capable of transmitting recipe tuning parameters to the processing unit.

3. The method according to claim 2, wherein the alignment model parameters are calculated by incorporating the recipe tuning parameters.

4. The method according to claim 3, wherein calculating alternative overlay error values is performed for the plurality of wafers being processed in different lots.

5. The method according to claim 1, wherein the alternative alignment values comprise alignment values recorded from alignment marks from alternative exposure fields on the plurality of wafers with respect to the active alignment values.

6. The method according to claim 1, wherein the alternative alignment values comprise alignment values of alternative alignment mark types on the plurality of wafers with respect to the active alignment values.

7. The method according to claim 1, wherein the alternative overlay error values comprise alternative alignment models of alignment marks on the plurality of wafers with respect to the active alignment values.

8. The method according to claim 1, further comprising estimating overlay stability based on the calculated alternative overlay error values for the plurality of wafers.

9. The method according to claim 8, wherein estimating overlay stability comprises calculating an overlay metric so as to judge overlay performance.

10. The method according to claim 9, wherein the estimated overlay stability is provided as intra lot overlay stability for the plurality of wafers.

11. The method according to claim 9, wherein the estimated overlay stability is provided as a lot-to-lot overlay stability for the plurality of wafers.

12. A method of calculating overlay stability based on alternative overlay settings in a fabrication unit, the method comprising:
providing a processing unit, the processing unit being capable of receiving overlay error values from an overlay measurement tool for a plurality of measurement positions on a plurality of semiconductor wafers and alignment data from an exposure tool suitable for exposing the plurality of semiconductor wafers, the alignment data comprising active alignment values applied by the exposure tool to respective ones of the plurality of semiconductor wafers and alternative alignment values recorded by the exposure tool;
providing a process server, the process server being capable of transmitting recipe tuning parameters to the processing unit;
calculating, with a processing unit, alignment model parameters from the active alignment values as applied by the exposure tool for the plurality of measurement positions by incorporating the recipe tuning parameters;
calculating, with a processing unit, alternative alignment model parameters from the active alignment values for the plurality of measurement positions;
calculating, with a processing unit, alternative overlay error values based on the alignment model parameters, the alternative alignment model parameters, and the overlay error values for the plurality of measurement positions; and
estimating, with a processing unit, overlay stability based on the calculated alternative overlay error values for the plurality of wafers, wherein the estimated overlay stability is provided as a lot-to-lot overlay stability for the plurality of wafers and wherein the lot-to-lot overlay stability for the plurality of wafers is further capable of signaling to switch the exposure tool using the alternative alignment values as an active alignment.

13. The method according to claim 12, wherein the alternative alignment values comprise alignment values recorded from alignment marks from alternative exposure fields on the plurality of wafers with respect to the active alignment values.

14. The method according to claim 12, wherein the alternative alignment values comprise alignment values of alternative alignment mark types on the plurality of wafers with respect to the active alignment values.

15. The method according to claim 12, wherein the alternative alignment values comprise alternative alignment recipes of alignment marks on the plurality of wafers with respect to the active alignment values.

16. The method according to claim 12, wherein the alternative alignment values comprise alternative alignment models of alignment marks on the plurality of wafers with respect to the active alignment values.

17. A fabrication system, comprising:
an exposure tool capable of exposing a plurality of semiconductor wafers;
an overlay measurement tool; and
a processing unit, the processing unit receiving overlay error values from the overlay measurement tool for a plurality of measurement positions on the plurality of semiconductor wafers and alignment data from the exposure tool, the alignment data comprising active alignment values applied by the exposure tool to respective ones of the plurality of semiconductor wafers and alternative alignment values recorded by the exposure tool;
wherein the processing unit calculates alignment model parameters from the active alignment values as applied by the exposure tool for the plurality of measurement positions, calculates alternative alignment model parameters from the active alignment values for the plurality of measurement positions, and calculates alternative overlay error values based on the alignment model parameters, the alternative alignment model parameters, and the overlay error values for the plurality of measurement positions, wherein the alternative overlay error values comprise alternative alignment recipes of alignment marks on the plurality of wafers with respect to the active alignment values.

18. The fabrication system according to claim 17, further comprising a first data connection arranged between the processing unit and the exposure tool and a second data connection connected between the processing unit and the overlay measurement tool.

19. A fabrication system, comprising:
an exposure tool suitable for exposing a plurality of semiconductor wafers;
an overlay measurement tool;
a processing unit receiving overlay error values from an overlay measurement tool for a plurality of measurement positions on a plurality of semiconductor wafers and alignment data from an exposure tool suitable for exposing the plurality of semiconductor wafers, the alignment data comprising active alignment values applied by the exposure tool to respective ones of the plurality of semiconductor wafers and alternative alignment values recorded by the exposure tool;
a process server transmitting recipe tuning parameters to the processing unit;
means for calculating alignment model parameters from the active alignment values as applied by the exposure tool for the plurality of measurement positions by incorporating the recipe tuning parameters;
means for calculating alternative alignment model parameters from the active alignment values for the plurality of measurement positions;
means for calculating alternative overlay error values based on the alignment model parameters, the alternative alignment model parameters, and the overlay error values for the plurality of measurement positions; and
means for estimating overlay stability based on the calculated alternative overlay error values for the plurality of wafers, wherein the estimated overlay stability is provided as a lot-to-lot overlay stability for the plurality of wafers and wherein the lot-to-lot overlay stability for the plurality of wafers is further capable of signaling to switch the exposure tool using the alternative alignment values as an active alignment.

20. A non-transitory computer readable medium, the computer readable medium including instructions capable of performing the following steps on a computer:
reading input data including overlay error values from an overlay measurement tool for a plurality of measurement positions on a plurality of semiconductor wafers and reading alignment data from an exposure tool suitable for exposing the plurality of semiconductor wafers, the alignment data comprising active alignment values applied by the exposure tool to respective ones of the plurality of semiconductor wafers and alternative alignment values recorded by the exposure tool;
calculating alignment model parameters from the active alignment values as applied by the exposure tool for the plurality of measurement positions; calculating alternative alignment model parameters from the active alignment values for the plurality of measurement positions;
calculating alternative overlay error values based on the alignment model parameters, the alternative alignment model parameters, and the overlay error values for the plurality of measurement positions; and
signaling to switch the exposure tool using the alternative alignment values as an active alignment.

21. The computer readable medium according to claim 20, further comprising instructions capable of estimating overlay stability based on the calculated alternative overlay error values for the plurality of wafers.

* * * * *